United States Patent
Ho et al.

(10) Patent No.: US 12,191,873 B2
(45) Date of Patent: Jan. 7, 2025

(54) DIGITAL-TO-ANALOG CONVERSION APPARATUS HAVING CURRENT SOURCE MEASURING MECHANISM AND CURRENT SOURCE MEASURING METHOD OF THE SAME

(71) Applicant: REALTEK SEMICONDUCTOR CORPORATION, Hsinchu (TW)

(72) Inventors: Hsuan-Ting Ho, Hsinchu (TW); Shih-Hsiung Huang, Hsinchu (TW); Liang-Wei Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 202 days.

(21) Appl. No.: 18/087,469

(22) Filed: Dec. 22, 2022

(65) Prior Publication Data
US 2023/0308105 A1    Sep. 28, 2023

(30) Foreign Application Priority Data
Mar. 24, 2022   (TW) .................................. 111111062

(51) Int. Cl.
*H03M 1/10* (2006.01)
*G01K 7/00* (2006.01)
*H03M 1/06* (2006.01)

(52) U.S. Cl.
CPC ............ *H03M 1/0607* (2013.01); *G01K 7/00* (2013.01)

(58) Field of Classification Search
CPC ...... H03M 1/0607; H03M 1/001; H03M 1/66; G01K 7/00

(Continued)

(56) References Cited

U.S. PATENT DOCUMENTS

| | | | |
|---|---|---|---|
| 7,333,603 B1 * | 2/2008 | Sallaway .............. | H04M 9/082 379/391 |
| 7,738,408 B2 * | 6/2010 | Chiu ..................... | H04L 5/1461 370/286 |

(Continued)

OTHER PUBLICATIONS

Lin et al. "U.S. Appl. No. 17/861,393", filed Jul. 11, 2022 (USPTO receipt date: Jul. 11, 2022), USA. 1-1) 17861393_spec 1-2) 17861393_drawing 1-3) 17861393_efilingAck46154872.

*Primary Examiner* — Peguy Jean Pierre
(74) *Attorney, Agent, or Firm* — WPAT, PC

(57) ABSTRACT

The present invention discloses a digital-to-analog conversion apparatus having current source measuring mechanism. A digital-to-analog conversion circuit in turn sets one of thermo-controlled current sources as an initial current source to operate according to two specific input codewords included in an input digital signal to generate an output analog signal. The values of the output analog signal corresponding to the two specific input codewords have opposite signs and the same absolute value. An echo transmission circuit processes the output analog signal to generate an echo signal. An echo-canceling circuit processes the input digital signal according to echo-canceling coefficients to generate an echo-canceling signal and receives an error signal to converge the echo-canceling coefficients. A current calculating circuit generates converged coefficients statistics values and perform calculation thereon with a predetermined inverse matrix to generate a current amount of each of the thermo-controlled current sources. An error calculation circuit subtracts the echo signal and the echo-canceling signal to generate the error signal.

12 Claims, 6 Drawing Sheets

(58) Field of Classification Search
 USPC .............................. 341/118, 120, 155, 144
 See application file for complete search history.

(56) References Cited

U.S. PATENT DOCUMENTS 10,644,863 B2 * 5/2020 Lin ..................... H04B 3/235
11,171,740 B2 * 11/2021 Huang ................ H04L 1/0021

* cited by examiner

| T01 | T02 | T03 | T04 | T05 | T06 | T07 | T08 | ••• | T25 | T26 | T27 | T28 | T29 | T30 | T31 |
|---|---|---|---|---|---|---|---|---|---|---|---|---|---|---|---|
| T02 | T03 | T04 | T05 | T06 | T07 | T08 | T09 | ••• | T26 | T27 | T28 | T29 | T30 | T31 | T01 |
| T03 | T04 | T05 | T06 | T07 | T08 | T09 | T10 | ••• | T27 | T28 | T29 | T30 | T31 | T01 | T02 |
| T04 | T05 | T06 | T07 | T08 | T09 | T10 | T11 | ••• | T28 | T29 | T30 | T31 | T01 | T02 | T03 |
| T05 | T06 | T07 | T08 | T09 | T10 | T11 | T12 | ••• | T29 | T30 | T31 | T01 | T02 | T03 | T04 |
| T06 | T07 | T08 | T09 | T10 | T11 | T12 | T13 | ••• | T30 | T31 | T01 | T02 | T03 | T04 | T05 |
| T07 | T08 | T09 | T10 | T11 | T12 | T13 | T14 | ••• | T31 | T01 | T02 | T03 | T04 | T05 | T06 |
| T08 | T09 | T10 | T11 | T12 | T13 | T14 | T15 | ••• | T01 | T02 | T03 | T04 | T05 | T06 | T07 |
| ⋮ | | | | | | | | | | | | | | | |
| T25 | T26 | T27 | T28 | T29 | T30 | T31 | T01 | ••• | T18 | T19 | T20 | T21 | T22 | T23 | T24 |
| T26 | T27 | T28 | T29 | T30 | T31 | T01 | T02 | ••• | T19 | T20 | T21 | T22 | T23 | T24 | T25 |
| T27 | T28 | T29 | T30 | T31 | T01 | T02 | T03 | ••• | T20 | T21 | T22 | T23 | T24 | T25 | T26 |
| T28 | T29 | T30 | T31 | T01 | T02 | T03 | T04 | ••• | T21 | T22 | T23 | T24 | T25 | T26 | T27 |
| T29 | T30 | T31 | T01 | T02 | T03 | T04 | T05 | ••• | T22 | T23 | T24 | T25 | T26 | T27 | T28 |
| T30 | T31 | T01 | T02 | T03 | T04 | T05 | T06 | ••• | T23 | T24 | T25 | T26 | T27 | T28 | T29 |
| T31 | T01 | T02 | T03 | T04 | T05 | T06 | T07 | ••• | T24 | T25 | T26 | T27 | T28 | T29 | T30 |

Fig. 3

DIGITAL-TO-ANALOG CONVERSION APPARATUS HAVING CURRENT SOURCE MEASURING MECHANISM AND CURRENT SOURCE MEASURING METHOD OF THE SAME

BACKGROUND OF THE INVENTION

1. Field of the Invention

The present invention relates to a digital-to-analog conversion apparatus having current source measuring mechanism and a current source measuring method of the same.

2. Description of Related Art

A digital-to-analog conversion apparatus is an important circuit component to convert a signal from a digital form to an analog form. The digital-to-analog conversion apparatus multiply different digital codes by corresponding conversion gain values to generate analog signals having different intensities.

However, for a current output digital-to-analog conversion apparatus, the process variation results in non-ideal offsets of the amplitude and the shape of the currents. The offset of the amplitude severely reduces the efficiency of the system.

SUMMARY OF THE INVENTION

In consideration of the problem of the prior art, an object of the present invention is to supply a digital-to-analog conversion apparatus and a digital-to-analog conversion method having current source measuring mechanism.

The present invention discloses a digital-to-analog conversion apparatus having current source measuring mechanism that includes a digital-to-analog conversion circuit, an echo transmission circuit, an echo-canceling circuit, a current calculation circuit an error calculation circuit. The digital-to-analog conversion circuit includes a plurality of thermometer-controlled current sources and configured to in turn set one of the thermometer-controlled current sources as an initial current source to be operated according to two specific input codewords included by an input digital signal, so as to generate an output analog signal according to a total current of the thermometer-controlled current sources, wherein the two specific input codewords control a thermometer-controlled operation status of each of the thermometer-controlled current sources to be one of a first current output status and a second current output status, and the two specific input codewords respectively make values of the output analog signal have opposite signs and substantially identical absolute values. The echo transmission circuit processes the output analog signal to generate an echo signal. The echo-canceling circuit processes the input digital signal according to a group of echo-canceling coefficients to generate an echo-canceling signal and to keep receiving an error signal to make the group of echo-canceling coefficients converge. The current calculation circuit performs statistics on the group of converged echo-canceling coefficients to generate a plurality of converged coefficients statistics values corresponding to a number of the thermometer-controlled current sources and perform calculation on the converged coefficients statistics values and a predetermined inverse matrix to generate a current amount of each of the thermometer-controlled current sources, wherein a predetermined matrix inverse to the predetermined inverse matrix reflects a different status section and an identical status section of each of the thermometer-controlled current sources corresponding to the two specific input codewords when each of the thermometer-controlled current sources is set to be the initial current source. The error calculation circuit subtracts the echo-canceling signal from the echo signal to generate the error signal.

The present invention also discloses a digital-to-analog conversion method having current source measuring mechanism used in a digital-to-analog conversion apparatus that includes steps outlined below. One of a plurality of thermometer-controlled current sources included by a digital-to-analog conversion circuit is set in turn as an initial current source to be operated according to two specific input codewords included by an input digital signal, so as to generate an output analog signal according to a total current of the thermometer-controlled current sources, wherein the two specific input codewords control a thermometer-controlled operation status of each of the thermometer-controlled current sources to be one of a first current output status and a second current output status, and the two specific input codewords respectively make values of the output analog signal have opposite signs and substantially identical absolute values. The output analog signal is processed by an echo transmission circuit to generate an echo signal. The input digital signal is processed according to a group of echo-canceling coefficients by an echo-canceling circuit to generate an echo-canceling signal and to keep receiving an error signal to make the group of echo-canceling coefficients converge. Statistics is performed on the group of converged echo-canceling coefficients by a current calculation circuit to generate a plurality of converged coefficients statistics values corresponding to a number of the thermometer-controlled current sources and calculation is performed on the converged coefficients statistics values and a predetermined inverse matrix to generate a current amount of each of the thermometer-controlled current sources, wherein a predetermined matrix inverse to the predetermined inverse matrix reflects a different status section and an identical status section of each of the thermometer-controlled current sources corresponding to the two specific input codewords when each of the thermometer-controlled current sources is set to be the initial current source. The echo-canceling signal is subtracted from the echo signal by an error calculation circuit to generate the error signal.

These and other objectives of the present invention will no doubt become obvious to those of ordinary skill in the art behind reading the following detailed description of the preferred embodiments that are illustrated in the various figures and drawings.

BRIEF DESCRIPTION OF THE DRAWINGS

FIG. 3 illustrates a diagram of the operation of the thermometer-controlled current sources according to an embodiment of the present invention.

DETAILED DESCRIPTION OF THE PREFERRED EMBODIMENTS

An aspect of the present invention is to provide a digital-to-analog conversion apparatus having current source measuring mechanism and a current source measuring method of the same to use two specific input codewords to control the digital-to-analog conversion circuit to output analog signals, in which values of the analog signals having opposite signs and substantially identical absolute values such that echo-canceling circuit makes coefficients therein converge and the current calculation circuit further calculates a current amount of each of the thermometer-controlled current sources according to the converged coefficients. The digital-to-analog conversion apparatus further generates a turn-on order of the thermometer-controlled current sources according to the relation of the current amount of each of the thermometer-controlled current sources to increase a linearity of the digital-to-analog conversion apparatus.

Figure 1:
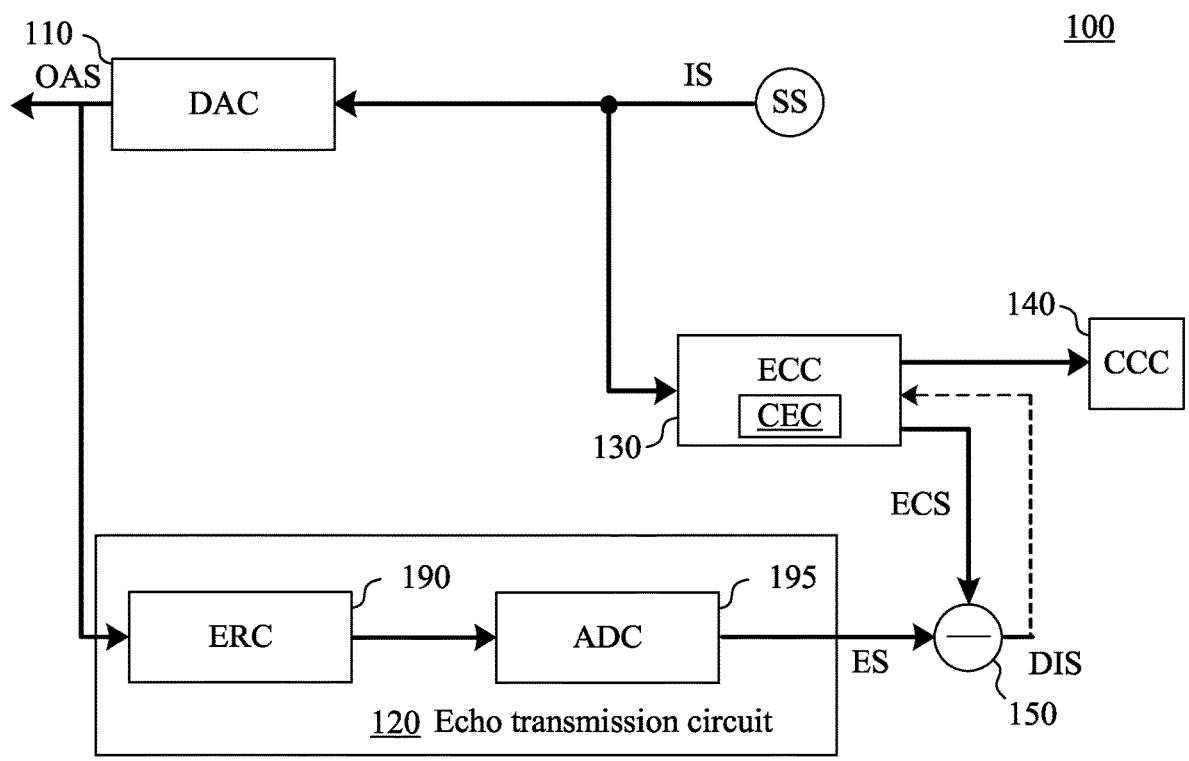
FIG. 1 illustrates a block diagram of a digital-to-analog conversion apparatus having current source measuring mechanism according to an embodiment of the present invention.

Reference is now made to FIG. 1. FIG. 1 illustrates a block diagram of a digital-to-analog conversion apparatus 100 having current source measuring mechanism according to an embodiment of the present invention. The digital-to-analog conversion apparatus 100 includes a digital-to-analog conversion circuit 110 (abbreviated as DAC in FIG. 1), an echo transmission circuit 120, an echo-canceling circuit 130 (abbreviated as ECC in FIG. 1), a current calculation circuit 140 (abbreviated as CCC in FIG. 1) and an error calculation circuit 150.

The digital-to-analog conversion circuit 110 receives an input digital signal IS having an input codeword from a signal source SS. In an embodiment, the signal source SS is such as, but not limited to a transmitter (TX) of a communication system.

Figure 2:
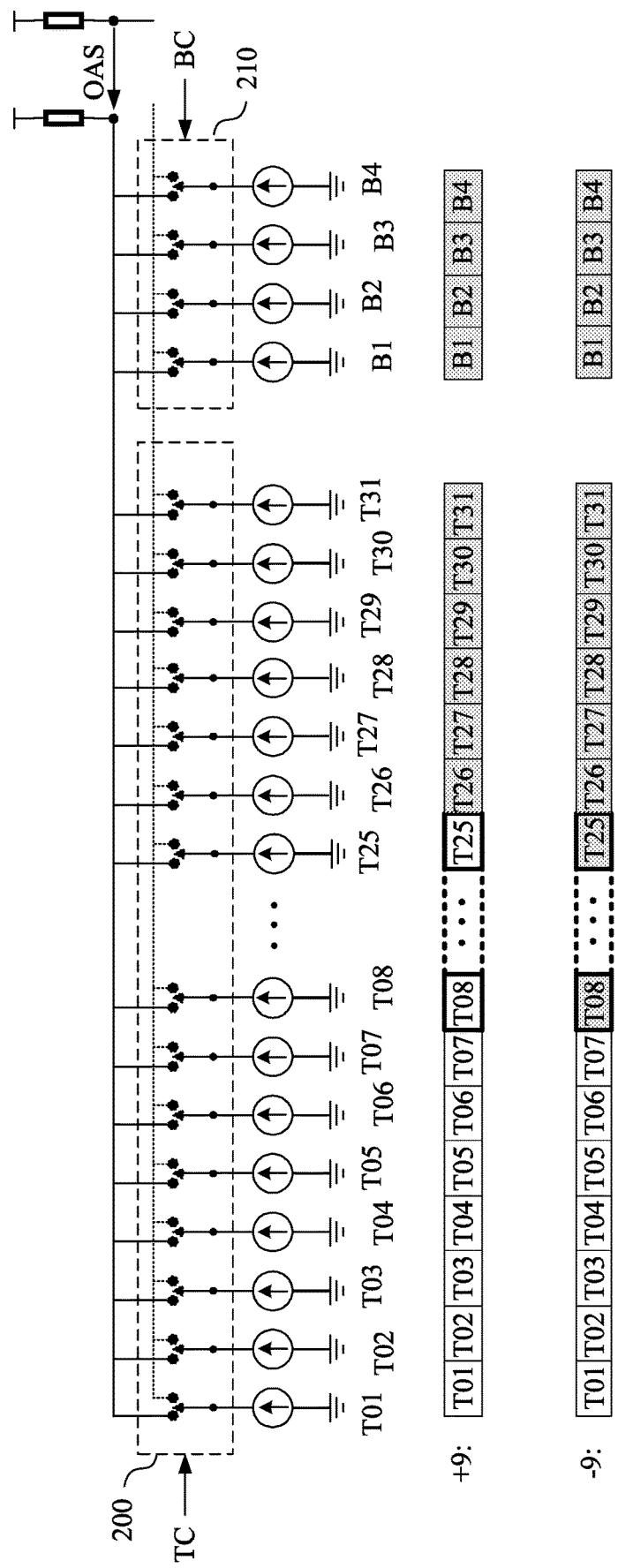
FIG. 2 illustrates a circuit diagram of the digital-to-analog conversion circuit according to an embodiment of the present invention.

Reference is now made to FIG. 2 at the same time. FIG. 2 illustrates a circuit diagram of the digital-to-analog conversion circuit 110 according to an embodiment of the present invention.

The digital-to-analog conversion circuit 110 includes a plurality of current sources. The current sources include a plurality of thermometer-controlled current sources T01-T31 (some of these current sources are not illustrated in the figure) and a plurality of binary-controlled current sources B1-B4. The input codeword of the input digital signal IS controls the operation status of each of current sources to be one of a first current output status and a second current output status so as to generate an output analog signal OAS according to a total current of the current sources. Under the first current output status and second current output status, each of the current sources outputs currents, in which the values of the current have opposite signs and substantially identical absolute values respectively.

In an embodiment, the input codeword of the input digital signal IS includes a plurality of thermometer codes TC to control the current sources T01-T31. Each of the current sources T01-T31 outputs a current of ½ unit under an ideal condition. In an embodiment, the thermometer codes TC controls a switching circuit 200 corresponding to the current sources T01-T31 such that each of the current sources T01-T31 is electrically coupled to different current output paths through the switching circuit 200, e.g., one of a solid line path and a dashed line path illustrated in FIG. 2, to be operated in one of the first current output status and the second current output status.

The thermometer codes have a number of A and are configured to control the thermometer-controlled current sources having a number of $2^A-1$ based on $2^A$ combinations of the thermometer codes. In the present embodiment, A is 5. As a result, 5 thermometer codes TC controls 31 thermometer-controlled current sources CA-CO based on 32 combinations of the thermometer codes TC.

In operation, when the thermometer codes change in turn from (00000), (00001), . . . to (11111) in a switching process, the current sources T01-T31 switch the operation status thereof in a manner similar to a thermometer. If the current source T01 is set to be an initial current source, the current sources T01-T31 are all under the second current output status in the beginning of the switching process. Subsequently, the current source T01, the current source T02, . . . and the current source T31 gradually switch from the second current output status to the first current output status one by one until the current sources T01-T31 are all under the first current output status.

In an embodiment, the codeword of the input digital signal IS further includes a plurality of binary codes BC to control the current sources B1-B4. Each of the current sources B1-B4 outputs a current of ¼ unit, ⅛ unit, ¹⁄₁₆ unit and ¹⁄₃₂ unit respectively. In an embodiment, the binary codes BC controls a switching circuit 210 corresponding to the current sources B1-B4 such that each of the current sources B1-B4 is electrically coupled to different current output paths through the switching circuit 210, e.g., one of a solid line path and a dashed line path illustrated in FIG. 2, to be operated in one of the first current output status and the second current output status.

The binary codes BC have a number of B and are configured to control the binary-controlled current sources having a number of B based on $2^B$ combinations of the binary codes BC.

In the present embodiment, B is 4. As a result, 4 binary codes BC controls 4 binary-controlled current sources B1-B4 based on 16 combinations of the binary codes BC.

In operation, when the binary codes change in turn from (0000), (0001), . . . to (1111) in a switching process, the current source B1 is under the second current output status and the first current output status when the highest digit is 0 and 1 respectively. The current source B2 is under the second current output status and the first current output status when the second highest digit is 0 and 1 respectively. The current source B3 is under the second current output status and the first current output status when the second lowest digit is 0 and 1 respectively. The current source B4 is under the second current output status and the first current output status when the lowest digit is 0 and 1 respectively.

As a result, by using the thermometer codes TC to control the switching circuit 200 and by using the binary codes BC to control the switching circuit 210, the digital-to-analog conversion circuit 110 generates the output analog signal OAS according to the total current of the current sources.

The echo transmission circuit 120 processes the output analog signal OAS to generate an echo signal ES. In an embodiment, the echo transmission circuit 120 includes an echo response circuit 190 (abbreviated as ERC in FIG. 1) and an analog-to-digital conversion circuit 195 (abbreviated as ADC in FIG. 1). Echo response circuit 190 performs echo response processing on the output analog signal OAS and the analog-to-digital conversion circuit 195 subsequently performs analog-to-digital conversion on the output analog signal OAS to generate the echo signal ES. In an embodiment, the echo transmission circuit 120 may further selectively include such as, but not limited to a digital low-pass filter or other digital signal processing circuit (not illustrated in the figure) to perform further digital processing on the echo signal ES.

The echo-canceling circuit 130 processes an error signal DIS according to a group of echo-canceling coefficients CEC to generate an echo-canceling signal ECS. It is appreciated that in an embodiment, the echo-canceling circuit 130 can be shared with a receiver (RX) in the communication system to cancel the echo from the transmitter to the receiver.

The current calculation circuit 140 performs statistics on the group of the echo-canceling coefficients CEC to generate the current amount of each of the thermometer-controlled current sources T01-T31 accordingly. The cooperation of the digital-to-analog conversion circuit 110, the echo-canceling circuit 130 and the current calculation circuit 140 are described in detail later.

The error calculation circuit 150 subtracts the echo-canceling signal ECS from the echo signal ES to generate the error signal DIS.

Due to the process variation, each of the current sources in the digital-to-analog conversion circuit 110 has a current offset value and outputs a current that slightly deviates from the value of ½ unit. In order to measure the current value offset of each of the current sources, the digital-to-analog conversion circuit 110 in turn sets one of the thermometer-controlled current sources T01-T31 as an initial current source to be operated according to two specific input codewords included by the input digital signal IS, so as to generate the output analog signal OAS according to the total current of the current sources.

The two specific input codewords control the thermometer-controlled operation status of each of the thermometer-controlled current sources T01-T31 to be one of the first current output status and the second current output status, and control the binary-controlled operation status of each of the binary-controlled current sources B1-B4 to be the same (e.g., either the first current output status or the second current output status). The two specific input codewords make values of the output analog signal OAS have opposite signs and substantially identical absolute values. The term "substantially" means that the absolute values of the output analog signal OAS that the two specific input codewords correspond to are not necessarily exactly the same and may include an error therebetween within a reasonable range.

For example, the two specific input codewords can be (10101) and (01000) such that the total current that each of the output analog signal OAS corresponds to is +9 unit and −9 unit respectively.

FIG. 2 illustrates the operation status of each of the current sources corresponding to the two specific input codewords according to an embodiment of the present invention. The first current output status is identified by white blocks and the second current output status is identified by non-white blocks.

When the current source T01 is set to be the initial current source and the input codeword (10101) corresponding to the total current of +9 is used, the current sources T01-T25 are under the first current output status, the current sources T26-T31 are under the second current output status and the current sources B1-B4 are under the second current output status. The total current that the output analog signal OAS corresponds to is +19/2−15/32≈+9 unit.

If the current source T01 is set to be the initial current source and the input codeword (01000) corresponding to the total current of −9 is used, the current sources T01-T07 are under the first current output status, the current sources T08-T31 are under the second current output status and the current sources B1-B4 are under the second current output status. The total current that the output analog signal OAS corresponds to is −17/2−15/32≈−9 unit.

Corresponding to the two specific input codewords described above, the thermometer-controlled current sources T01-T31 includes a different status section corresponding to the current sources T08-T25 and an identical status section corresponding to the current sources T01-T07 and T26-T31. In FIG. 2, blocks each with a thick line frame are used to identify the different status section and blocks each with a thin line frame are used to identify the identical status section.

Reference is now made to FIG. 3. FIG. 3 illustrates a diagram of the operation of the thermometer-controlled current sources T01-T31 according to an embodiment of the present invention.

As illustrated in FIG. 3, according to the two specific input codewords described above, the digital-to-analog conversion circuit 110 in turn sets one of the thermometer-controlled current sources T01-T31 to be the initial current source to be operated according to the two specific input codewords included in the input digital signal IS, so as to generate the output analog signal OAS according to the total current of the current sources. The first row in FIG. 3 corresponds to the operation condition when the thermometer-controlled current source T01 is set to be the initial current source. The second row in FIG. 3 corresponds to the operation condition when the thermometer-controlled current source T02 is set to be the initial current source. Similarly, the last row (the 31st row) in FIG. 3 corresponds to the operation condition when the thermometer-controlled current source T31 is set to be the initial current source.

Under the operation of the digital-to-analog conversion circuit 110, the echo-canceling circuit 130 keeps receiving the error signal DIS to make the group of the echo-canceling coefficients CEC converge. In an embodiment, the echo-canceling circuit 130 makes the echo-canceling coefficients CEC converge according to the error signal DIS by using such as, but not limited to a least mean square training process.

The current calculation circuit 140 performs statistics on the group of converged echo-canceling coefficients CEC to generate a plurality of converged coefficients statistics values corresponding to a number of the thermometer-controlled current sources T01-T31 and performs calculation on the converged coefficients statistics values and a predetermined inverse matrix to generate a current amount of each of the thermometer-controlled current sources T01-T31. A predetermined matrix inverse to the predetermined inverse matrix reflects the different status section and the identical status section of each of the thermometer-controlled current sources T01-T31 corresponding to the two specific input codewords when each of the thermometer-controlled current sources T01-T31 is set to be the initial current source.

Figure 4:
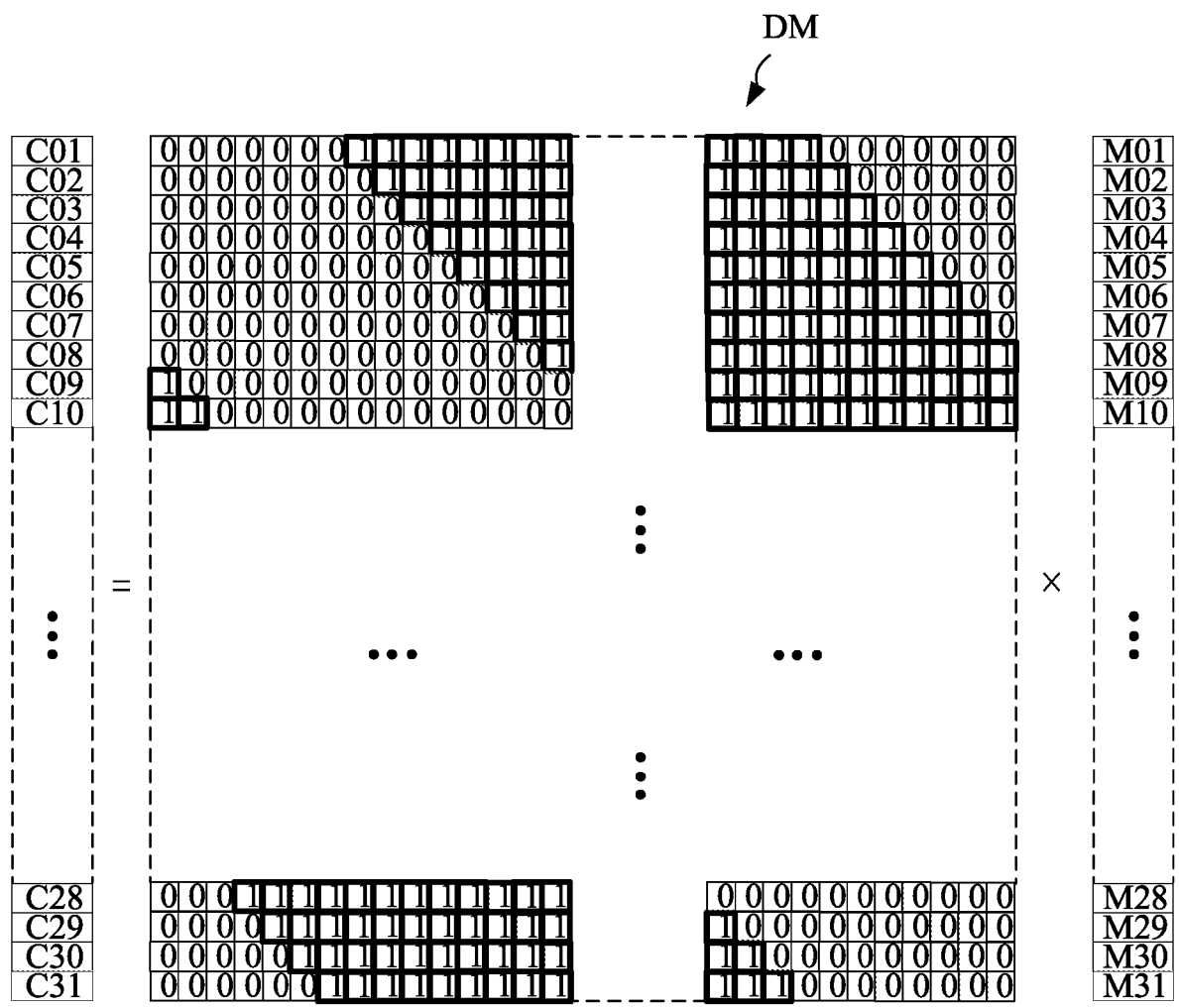
FIG. 4 illustrates the relation among the converged coefficients statistics values, the predetermined matrix and the current amounts of the thermometer-controlled current sources according to an embodiment of the present invention.

Reference is now made to FIG. 4. FIG. 4 illustrates the relation among the converged coefficients statistics values C01-C31, the predetermined matrix DM and the current amounts M01-M31 of the thermometer-controlled current sources T01-T31 according to an embodiment of the present invention.

In an embodiment, corresponding to the number of the thermometer-controlled current sources, the echo-canceling circuit 130 generates a plurality of converged coefficient groups each having a plurality of converged coefficients. The current calculation circuit 140, for each of the converged coefficient groups, retrieves and sums absolute values of the converged coefficients up to generate the converged coefficients statistics values.

For example, when the current sources T01 is set to be the initial current source, the digital-to-analog conversion circuit 110 keeps generating the output analog signal OAS such that the echo-canceling circuit 130 keeps receiving the error signal DIS to make the echo-canceling coefficients CEC converge to generate a converged coefficient group that includes a plurality of converged coefficients. The current calculation circuit 140 retrieves and sums absolute values of the converged coefficients in such a converged coefficient group up to generate the converged coefficients statistics value C01 in FIG. 4.

Subsequently, when the current sources T02 is set to be the initial current source, the echo-canceling circuit 130 and the current calculation circuit 140 perform identical operation to generate the converged coefficients statistics value C02 in FIG. 4. Similarly, when the current sources T31 is set to be the initial current source, the echo-canceling circuit 130 and the current calculation circuit 140 perform identical operation to generate the converged coefficients statistics value C31 in FIG. 4. As a result, corresponding to the number of the current sources T01-T31, the current calculation circuit 140 generates 31 converged coefficients statistics values C01-C31.

In an embodiment, in the calculation process described above, the current calculation circuit 140, for each of the converged coefficient groups, only selects a part of the converged coefficients to retrieve and sum the absolute values of the selected converged coefficients up to generate the converged coefficients statistics values C01-C31. The selected converged coefficients may have such as, but not limited to relative larger values than the other part of the unselected converged coefficients. By using such a method, not only the operation amount of the current calculation circuit 140 can be reduced, the noise interference can be reduced as well.

Since the converging process of the echo-canceling circuit is performed according to the values having fixed amounts (+9 and −9), the corresponding amplitude information gathers to the converged coefficients. Further, the information corresponding to the identical status section is a direct current component and can be removed by a high pass filtering process such that only the information corresponding to the different status section remains. As a result, the converged coefficients statistics values C01-C31 is equivalent to a multiplication result of the predetermined matrix DM and the current amounts M01-M31 of the thermometer-controlled current sources.

In an example, the number of the thermometer-controlled current sources is M and a size of the predetermined matrix DM is M×M. Each of a plurality of rows of the predetermined matrix DM corresponds to an arrangement of the thermometer-controlled current sources T01-T31. Each of the rows, corresponding to the different status section and the identical status section when each of the thermometer-controlled current sources T01-T31 is set to be the initial current source, includes a plurality of first elements each having a value of 1 and a plurality of second elements each having a value of 0. Similar to FIG. 3, blocks each with a thick line frame are used to identify the different status section and blocks each with a thin line frame are used to identify the identical status section in FIG. 4.

As a result, after obtaining the converged coefficients statistics values C01-C31 according to the operation of the echo-canceling circuit 130 and the current calculation circuit 140, the current calculation circuit 140 further performs calculation according to the predetermined inverse matrix that the predetermined matrix DM corresponds to, so as to generate the current amounts M01-M31 of the thermometer-controlled current sources T01-T31.

Figure 5:
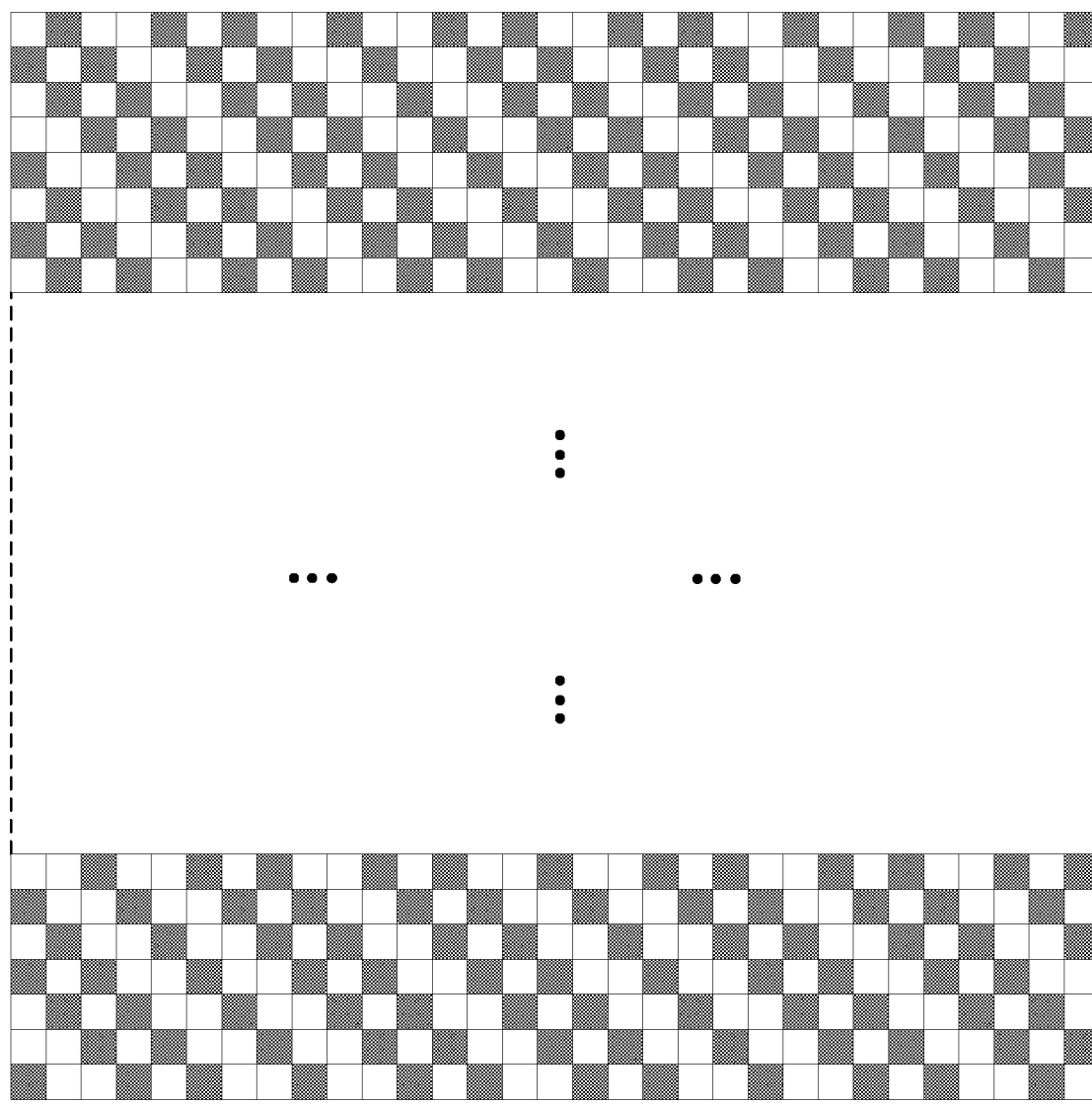
FIG. 5 illustrates a diagram of the predetermined inverse matrix according to an embodiment of the present invention.

Reference is now made to FIG. 5. FIG. 5 illustrates a diagram of the predetermined inverse matrix ADM according to an embodiment of the present invention.

As illustrated in 5, the elements in the predetermined inverse matrix ADM corresponding to the predetermined matrix DM only have two values, which are +7 and −11. The elements corresponding to the value of +7 are identified as blank frames. The elements corresponding to the value of −11 are identified as dotted frames.

It is appreciated that when different two specific input codewords are used, the predetermined inverse matrix ADM having different elements are generated. The values of the elements in the predetermined inverse matrix ADM are not limited thereto.

As a result, the current amounts M01-M31 of the thermometer-controlled current sources T01-T31 can be obtained according to the operation of the echo-canceling circuit 130 and the current calculation circuit 140.

It is appreciated that in the embodiments described above, the echo-canceling circuit 130 and the current calculation circuit 140 are described as two independent circuits. However, in other embodiments, the echo-canceling circuit 130 and the current calculation circuit 140 can be integrated into a single circuit. Further, in the embodiments described above, the number of the current sources and the amounts of the currents are merely an example. In other embodiments, the number of the current sources and the amounts of the currents can be different depending on practical requirements. The present invention is not limited thereto.

In an embodiment, the digital-to-analog conversion circuit 110 is further configured to calculate an average current amount of the thermometer-controlled current sources T01-T31 by using a built-in control circuit to, according to the average current amount and the current amount of each of the thermometer-controlled current sources T01-T31, perform a sorting process on a plurality of current offset values to generate a turn-on order.

For example, the current offset values can be distinguished into a plurality of current offset value groups according to the turn-on order. The current offset values in each two neighboring current offset value groups have opposite signs such that the current offset values cancel out when the current offset values of these groups are gradually accumulated along with the turn-on order. An absolute value of the total current offset value of these current offset values can be kept to be not larger than a half of a largest absolute value among these current offset values.

The digital-to-analog conversion circuit 110 turns on the thermometer-controlled current sources T01-T31 according to the thermometer codes TC included by the input digital signal IS based on the turn-on order under an operation mode.

It is appreciated that the setting of the turn-on order is merely an example. In different embodiments, the digital-to-analog conversion circuit 110 can use different methods to set the turn-on order according to the current amounts M01-M31 of the thermometer-controlled current sources T01-T31. The present invention is not limited thereto.

As a result, the digital-to-analog conversion apparatus of the present invention uses two specific input codewords to control the digital-to-analog conversion circuit to output analog signals, in which values of the analog signals having opposite signs and substantially identical absolute values such that echo-canceling circuit makes coefficients therein converge and the current calculation circuit further calculates a current amount of each of the thermometer-controlled current sources according to the converged coefficients. The digital-to-analog conversion apparatus further generates a turn-on order of the thermometer-controlled current sources according to the relation of the current amount of each of the thermometer-controlled current sources to increase a linearity of the digital-to-analog conversion apparatus.

Figure 6:
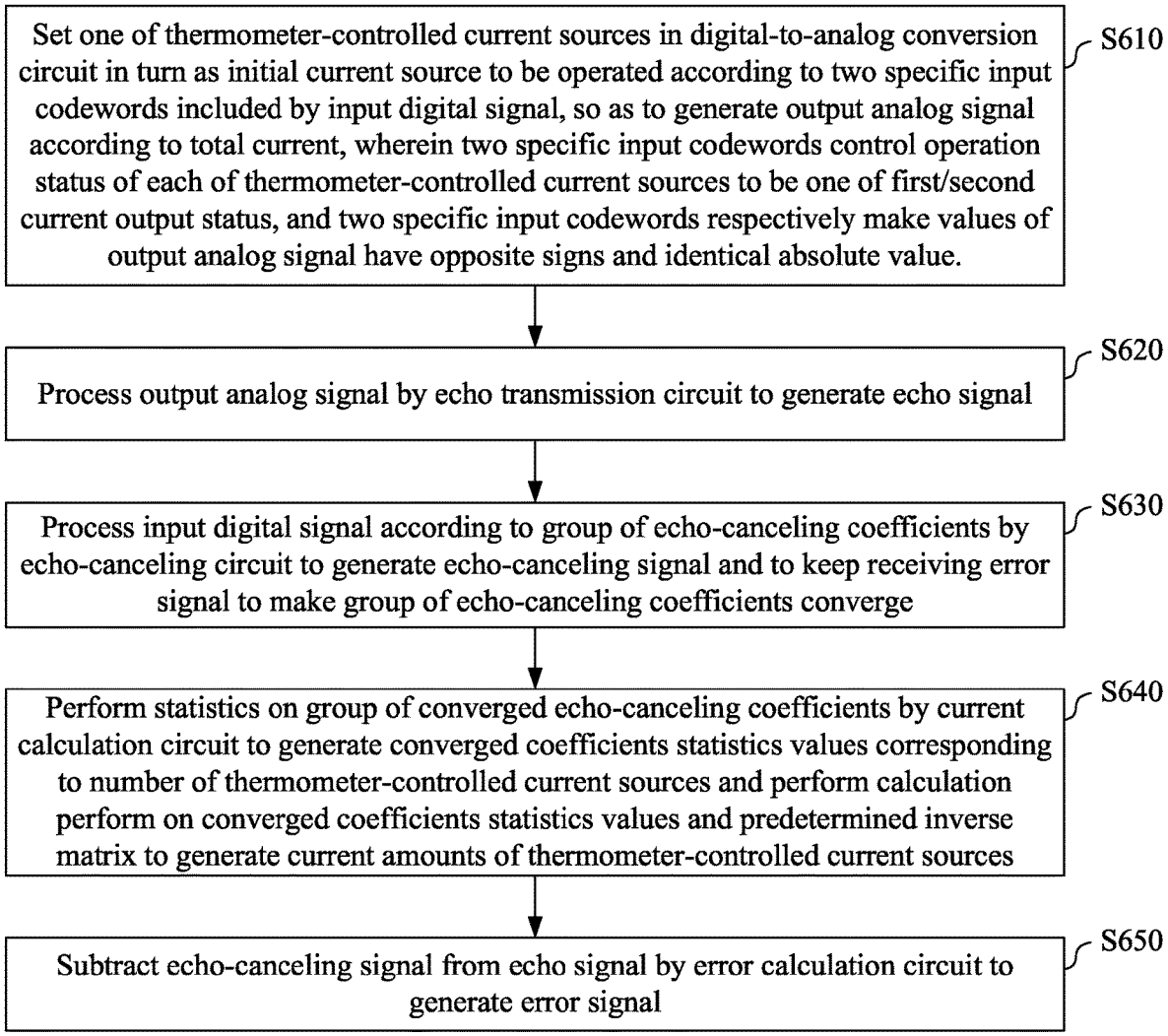
FIG. 6 illustrates a flow chart of a current source measuring method according to an embodiment of the present invention.

Reference is now made to FIG. 6. FIG. 6 illustrates a flow chart of a current source measuring method 600 according to an embodiment of the present invention.

In addition to the apparatus described above, the present disclosure further provides the current source measuring method 600 that can be used in such as, but not limited to, the digital-to-analog conversion apparatus 100 in FIG. 1. As illustrated in FIG. 6, an embodiment of the current source measuring method 600 includes the following steps.

In step S610, one of the thermometer-controlled current sources T01-T31 included by the digital-to-analog conversion circuit 110 is set in turn as the initial current source to be operated according to two specific input codewords included by the input digital signal IS, so as to generate the output analog signal OAS according to the total current of the thermometer-controlled current sources T01-T31, wherein the two specific input codewords control the thermometer-controlled operation status of each of the thermometer-controlled current sources T01-T31 to be one of the first current output status and the second current output status, and the two specific input codewords respectively make the values of the output analog signal OAS have opposite signs and the substantially identical absolute value.

In step S620, the output analog signal OAS is processed by the echo transmission circuit 120 to generate the echo signal ES.

In step S630, the input digital signal IS is processed according to the group of echo-canceling coefficients CEC by the echo-canceling circuit 130 to generate the echo-canceling signal ECS and to keep receiving the error signal DIS to make the group of echo-canceling coefficients CEC converge.

In step S640, statistics is performed on the group of converged echo-canceling coefficients CEC by the current calculation circuit 140 to generate the converged coefficients statistics values C01-C31 corresponding to the number of the thermometer-controlled current sources T01-T31 and calculation is performed on the converged coefficients statistics values C01-C31 and the predetermined inverse matrix ADM to generate the current amounts M01-M31 of the thermometer-controlled current sources C01-C31.

In step S650, the echo-canceling signal ECS is subtracted from the echo signal ES by the error calculation circuit 150 to generate the error signal DIS.

It is appreciated that the embodiments described above are merely an example. In other embodiments, it should be appreciated that many modifications and changes may be made by those of ordinary skill in the art without departing, from the spirit of the disclosure.

In summary, the present invention discloses the digital-to-analog conversion apparatus and the digital-to-analog conversion method having current source measuring mechanism that use two specific input codewords to control the digital-to-analog conversion circuit to output analog signals, in which values of the analog signals having opposite signs and substantially identical absolute values such that echo-canceling circuit makes coefficients therein converge and the current calculation circuit further calculates a current amount of each of the thermometer-controlled current sources according to the converged coefficients. The digital-to-analog conversion apparatus further generates a turn-on order of the thermometer-controlled current sources according to the relation of the current amount of each of the thermometer-controlled current sources to increase a linearity of the digital-to-analog conversion apparatus.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A digital-to-analog conversion apparatus having current source measuring mechanism, comprising:
    a digital-to-analog conversion circuit comprising a plurality of thermometer-controlled current sources and configured to in turn set one of the thermometer-controlled current sources as an initial current source to be operated according to two specific input codewords comprised by an input digital signal, so as to generate an output analog signal according to a total current of the thermometer-controlled current sources, wherein the two specific input codewords control a thermometer-controlled operation status of each of the thermometer-controlled current sources to be one of a first current output status and a second current output status, and the two specific input codewords respectively make values of the output analog signal have opposite signs and substantially identical absolute values;
    an echo transmission circuit to process the output analog signal to generate an echo signal;
    an echo-canceling circuit to process the input digital signal according to a group of echo-canceling coefficients to generate an echo-canceling signal and to keep receiving an error signal to make the group of echo-canceling coefficients converge;
    a current calculation circuit to perform statistics on the group of converged echo-canceling coefficients to generate a plurality of converged coefficients statistics values corresponding to a number of the thermometer-controlled current sources and perform calculation on the converged coefficients statistics values and a predetermined inverse matrix to generate a current amount of each of the thermometer-controlled current sources, wherein a predetermined matrix inverse to the predetermined inverse matrix reflects a different status section and an identical status section of each of the thermometer-controlled current sources corresponding to the two specific input codewords when each of the thermometer-controlled current sources is set to be the initial current source; and
    an error calculation circuit to subtract the echo-canceling signal from the echo signal to generate the error signal.

2. The digital-to-analog conversion apparatus of claim 1, wherein the echo-canceling circuit, corresponding to the number of the thermometer-controlled current sources, generates a plurality of converged coefficient groups each having a plurality of converged coefficients; and the current calculation circuit, for each of the converged coefficient groups, retrieves and sums absolute values of the converged coefficients up to generate the converged coefficients statistics values.

3. The digital-to-analog conversion apparatus of claim 2, wherein the current calculation circuit, for each of the converged coefficient groups, selects a part of the converged coefficients having relative larger values than the other part of the converged coefficients to retrieve and sum the absolute values of the selected converged coefficients up to generate the converged coefficients statistics values.

4. The digital-to-analog conversion apparatus of claim 1, wherein the number of the thermometer-controlled current sources is M and a size of the predetermined matrix is M×M; and each of a plurality of rows of predetermined matrix corresponds to an arrangement of the thermometer-controlled current sources and each of the rows, corresponding to the different status section and the identical status section when each of the thermometer-controlled current sources is set to be the initial current source, comprises a plurality of first elements each having a value of 1 and a plurality of second elements each having a value of 0.

5. The digital-to-analog conversion apparatus of claim 1, wherein the digital-to-analog conversion circuit further comprises a plurality of binary-controlled current sources, and the digital-to-analog conversion circuit, according to the two specific input codewords, controls the binary-controlled current sources to have a same binary-controlled operation status, so as to generate the output analog signal according to the total current of the thermometer-controlled current sources and the binary-controlled current sources.

6. The digital-to-analog conversion apparatus of claim 1, wherein the digital-to-analog conversion circuit is further configured to calculate an average current amount of the thermometer-controlled current sources to, according to the average current amount and the current amount of each of the thermometer-controlled current sources, perform a sorting process on a plurality of current offset values to generate a turn-on order; and the digital-to-analog conversion circuit turns on the thermometer-controlled current sources according to a plurality of thermometer codes comprised by the input digital signal based on the turn-on order under an operation mode.

7. A current source measuring method used in a digital-to-analog conversion apparatus, comprising:

setting one of a plurality of thermometer-controlled current sources comprised by a digital-to-analog conversion circuit in turn as an initial current source to be operated according to two specific input codewords comprised by an input digital signal, so as to generate an output analog signal according to a total current of the thermometer-controlled current sources, wherein the two specific input codewords control a thermometer-controlled operation status of each of the thermometer-controlled current sources to be one of a first current output status and a second current output status, and the two specific input codewords respectively make values of the output analog signal have opposite signs and substantially identical absolute values;

processing the output analog signal by an echo transmission circuit to generate an echo signal;

processing the input digital signal according to a group of echo-canceling coefficients by an echo-canceling circuit to generate an echo-canceling signal and to keep receiving an error signal to make the group of echo-canceling coefficients converge;

performing statistics on the group of converged echo-canceling coefficients by a current calculation circuit to generate a plurality of converged coefficients statistics values corresponding to a number of the thermometer-controlled current sources and performing calculation on the converged coefficients statistics values and a predetermined inverse matrix to generate a current amount of each of the thermometer-controlled current sources, wherein a predetermined matrix inverse to the predetermined inverse matrix reflects a different status section and an identical status section of each of the thermometer-controlled current sources corresponding to the two specific input codewords when each of the thermometer-controlled current sources is set to be the initial current source; and subtracting the echo-canceling signal from the echo signal by an error calculation circuit to generate the error signal.

8. The current source measuring method of claim 7, further comprising:

corresponding to the number of the thermometer-controlled current sources, generating a plurality of converged coefficient groups each having a plurality of converged coefficients by the echo-canceling circuit; and for each of the converged coefficient groups, retrieving and summing absolute values of the converged coefficients up to generate the converged coefficients statistics values by the current calculation circuit.

9. The current source measuring method of claim 8, further comprising:

for each of the converged coefficient groups, selecting a part of the converged coefficients having relative larger values than the other part of the converged coefficients to retrieve and sum the absolute values of the selected converged coefficients up to generate the converged coefficients statistics values by the current calculation circuit.

10. The current source measuring method of claim 7, wherein the number of the thermometer-controlled current sources is M and a size of the predetermined matrix is M×M; and each of a plurality of rows of predetermined matrix corresponds to an arrangement of the thermometer-controlled current sources and each of the rows, corresponding to the different status section and the identical status section when each of the thermometer-controlled current sources is set to be the initial current source, comprises a plurality of first elements each having a value of 1 and a plurality of second elements each having a value of 0.

11. The current source measuring method of claim 7, wherein the digital-to-analog conversion circuit further comprises a plurality of binary-controlled current sources, the current source measuring method further comprising:

according to the two specific input codewords, controlling the binary-controlled current sources to have a same binary-controlled operation status by the digital-to-analog conversion circuit, so as to generate the output analog signal according to the total current of the thermometer-controlled current sources and the binary-controlled current sources.

12. The current source measuring method of claim 7, further comprising:

calculating an average current amount of the thermometer-controlled current sources by the digital-to-analog conversion circuit to, according to the average current amount and the current amount of each of the thermometer-controlled current sources, perform a sorting process on a plurality of current offset values to generate a turn-on order; and turning on the thermometer-controlled current sources by the digital-to-analog conversion circuit according to a plurality of thermometer codes comprised by the input digital signal based on the turn-on order under an operation mode.

\* \* \* \* \*